United States Patent [19]

Ando et al.

[11] Patent Number: 5,130,690
[45] Date of Patent: Jul. 14, 1992

[54] PHOTOCONDUCTOR

[75] Inventors: Yuji Ando; Tomohiro Itoh, both of Tokyo, Japan

[73] Assignee: NEC Corporation, Tokyo, Japan

[21] Appl. No.: 446,455

[22] Filed: Dec. 5, 1989

[30] Foreign Application Priority Data

Dec. 6, 1988 [JP] Japan .................. 63-309324

[51] Int. Cl.⁵ .................. H01C 31/08; H01C 40/14
[52] U.S. Cl. ..................... 338/15; 250/211 J; 250/211 K
[58] Field of Search .......... 338/15; 357/30, 31; 250/211 R, 211 J, 211 K; 430/58

[56] References Cited

U.S. PATENT DOCUMENTS 3,961,998  6/1976  Scharnhorst et al. ............ 338/15 X

OTHER PUBLICATIONS

Sze, "Photoconductor", *Physics of Semiconductor Devices* (1981), pp. 744-748.
Sakaki, "Scattering Suppression and High-Mobility Effect of Size-Quantized Electrons . . . Structures", *Japanese J. of Appl. Phys.*, vol. 19, No. 12, Dec. 1980, pp. L735-L738.
Yamada et al., *Institute of Electronics, Information and Communication Engineers*, Technical Report, ED87-99 (1987), pp. 15-22.
Yamada et al., "High-Field Electron Transport in Quantum wires Studied by Solution of the Boltzmann Equation", *Physical Review B*, vol. 40, No. 9, Sep. 1989, pp. 6265-6271.

*Primary Examiner*—Marvin M. Lateef
*Attorney, Agent, or Firm*—Burns, Doane, Swecker & Mathis

[57]  ABSTRACT

A photoconductor which has an active layer including channels of ultrafine wire structures each having cross sectional lengths comparable to an electron de Broglie wavelength is provided. The photoconductor has a high gain and a considerably increased response speed. The electric current of the photoconductor may also be increased by introducing a superlattice structure.

8 Claims, 3 Drawing Sheets

PRIOR ART

PHOTOCONDUCTOR

BACKGROUND OF THE INVENTION

1. Filed of the invention

The present invention relates to constitution of a photoconductor, particularly constitution of a photoconductor which enables to improve its response velocity.

2. Description of the prior art

An example of prior art photoconductors is shown in attached FIG. 3. Such photoconductor has already been reported, for example, by Sze in "Physics of Semiconductor Devices" (1981) at pages 744-748. The photoconductor of FIG. 3 comprises a semi-insulating GaAs substrate 1, an active layer 33 consisting of non-doped GaAs formed on the layer 1 and ohmic electrodes A1 and A2 formed on opposite ends of the active layer 33. When a light beam 4 having energy exceeding a bandgap of GaAs is impinged on the upper surface of the active layer 33, under condition that an electric potential is loaded between the electrodes A1 and A2, electron-hole pairs are generated to cause flow of photocurrent.

The photocurrent gain GN and the response time TR of a photoconductor can be expressed by the formulae as follows:

$$GN = Un \cdot Tc \cdot E / L \quad (1)$$

$$TR = L / (Un \cdot E) \quad (2)$$

wherein Un is a carrier mobility, Tc is a carrier lifetime, E is an electric field and L is an electrode spacing. In a photoconductor whose active layer is formed by a non-doped semiconductor, when compared with a photodiode or the like, a greater gain can be obtained owing to a longer carrier lifetime, but on the other hand, a larger electrode spacing and a lower electric field are employed and so there is a problem of a longer response time.

SUMMARY OF THE INVENTION

An object of the present invention is therefore to present a photoconductor which enables to shorten the response time while maintaining the greater gain and solve thereby the above problem.

According to the present invention, a photoconductor is provided, said photoconductor is characterized in that it has an active layer comprising channels of ultrafine wire structures each having cross sectional lengths comparable to an electron de Broglie wavelength [such ultrafine wire structures will hereinafter be called "size-quantized wires"].

The size-quantized wires are formed on a semiconductor layer in bulk form having a greater bandgap and so the incident light beam is absorbed exclusively by the size-quantized wires, that is, any influence by the conductivity of the bulk layer becomes negligible. It is further possible to increase the electric current by giving a superlattice constitution to the size-quantized wires.

As reported by Sakaki in "Japanese Journal of Applied Physics", Vol. 19, No. 12 (1980), pages L735-L738, the size-quantized wires suppresses elastic or small-angle scattering and so it is expected that low electric field mobility of electrons will be above at least $10^6$, cm$^2$/Vs at low temperatures where ionized-impurity scattering is dominating. Further, it was reported by Yamada, et al., in "Institute of Electronics, Information and Communication Engineers, Technical Report", ED87-99 (1987), pages 15-22, that one-dimensional state density decreases along with energy and so electrons accelerated to have more than energy of optical phonons in a high electric field will tend to be less scattered as they are accelerated and thus will tend to have rapidly increasing drift velocity.

The present invention has its basis upon such principles and is one to constitute an active layer, which was conventionally formed by a bulk semiconductor, by size-quantized wires, whereby to improve its carrier mobility and considerably shorten a response time of a photocon-ductor.

More particularly, according to the present invention, an active layer of a photoconductor is constituted by size-quantized wires so that high mobility of electrons may be obtained, whereby it becomes possible to shorten the response time and at the same time to achieve greater gain in accordance with the above formulae (1) and (2).

In order to fully take up the high-mobility effect by the size-quantized wires, it is desirable that the incident light beam is absorbed only by the size-quantized wires and there is no contribution by the conductivity of the bulk layer. It is therefore possible and advantageous to eliminate any influence by the bulk layer by constituting the bulk layer under the size-quantized wires by a semiconductor having a bandgap greater than that of a semiconductor which forms the size-quantized wires and by using as the incident light beam a light beam having an energy lower than the bandgap of the bulk layer and higher than the bandgap of the active layer.

There is a problem that the size-quantized wires permit flow of only small amount of electric current per unit channel width, despite of the high-mobility effect. This is because cross sectional area of the size-quantized wires is limited to an extent of 100 Å × 100 Å. It is possible to solve such problem by increasing the number of the size-quantized wires, but such solution is not always desirable owing to the fact that it eventually results in increase of device sizes. In such case, it is advantageous to give a superlattice constitution having multiple active layers to each of the size-quantized wires so that a greater amount of electric current may be permitted to flow. In such superlattice constitution, each of quantum well layers forms an active layer comprising size-quantized wires and quantum barrier layers suppress any leak of electrons out of quantum wells, so that the one-dimensional property of the channels may be assured.

DESCRIPTION OF THE PREFERRED EMBODIMENTS

The present invention will be explained below further in detail with respect to its some embodiments.

Figure 1A:
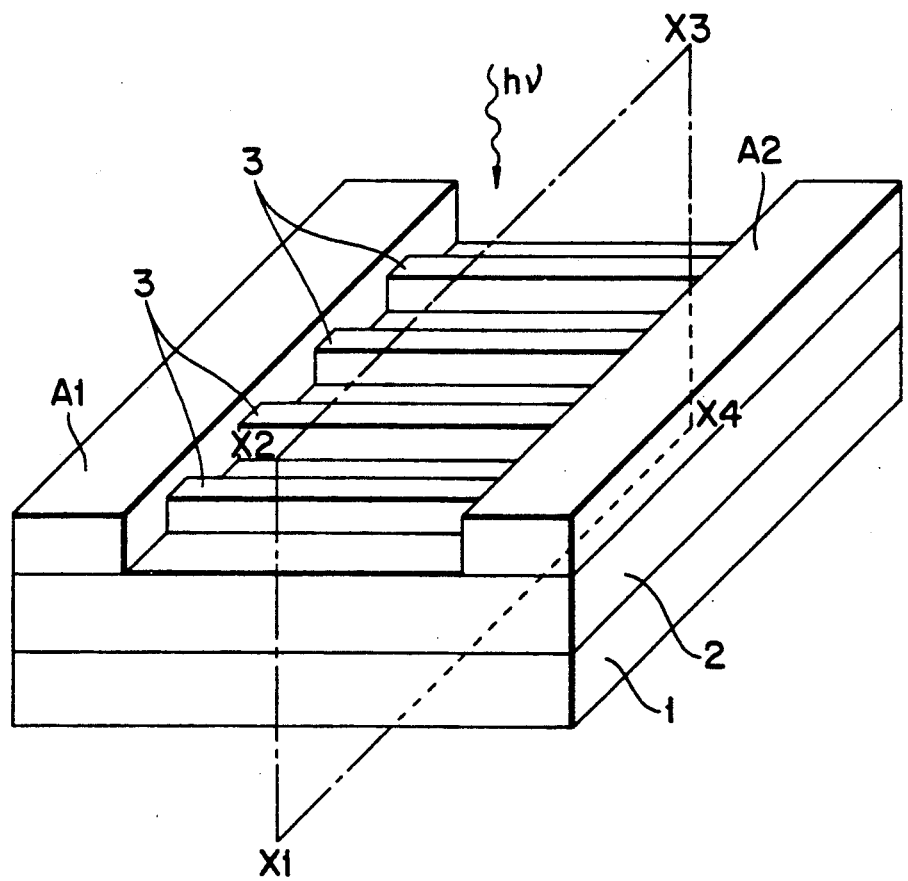
FIG. 1 shows a schematic illustration of construction of a photoconductor according to an embodiment of the present invention; (a) being a perspective view and (b) being a cross section of (a) cut along a plane X1-X2-X3-X4-X1 shown in (a).
Figure 1B:
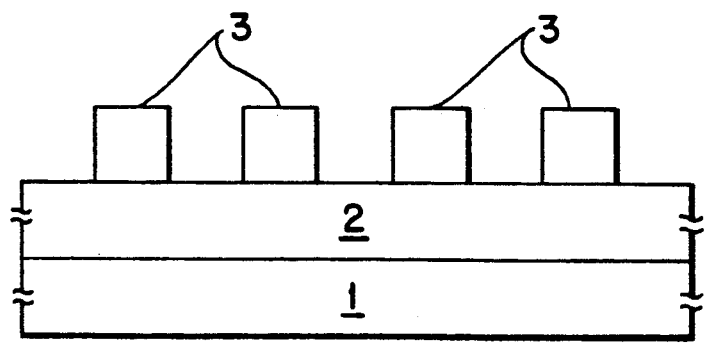

A first embodiment of the photoconductor of the present invention has a device constitution as shown in FIG. 1(a) and FIG. 1(b). The photoconductor comprises a semi-insulated GaAs substrate 1, a non-doped $Al_{0.4}Ga_{0.6}As$ buffer layer 2 formed in a thickness of 1 μm on the substrate 1 and plural wire channels 3 consisting of insulated GaAs formed in a width and a height to an extent of 100 Å respectively on a surface of the buffer layer 2. At both ends of the wire channels 3, ohmic electrodes A1 and A2 are formed.

When a light beam having a wavelength in a range of 0.65 to 0.86 μm is impinged on the upper surface of the device, the incident light beam is absorbed only in the GaAs and thus photoexcitation of carriers occurs in the wire channels 3. No incident light beam is absorbed in the AlGaAs layer 2 and so it is possible to pick up only the photocurrent in the wire channels 3 through the electrodes A1 and A2. Since the cross section of the wire channels 3 has a dimension to an extent of de Broglie wavelength of electrons, the carriers behave in a one-dimensional manner and so, as explained in the above, it becomes possible to obtain high mobility and high drift velocity.

The above photoconductor can be produced by process steps by themselves known. For example, by a molecular beam epitaxial growth method, a non-doped AlGaAs layer in a thickness of 1 μm and a non-doped GaAs layer in a thickness of 100 Å are grown in this order. Then, etching is made by using a resist pattern formed for example by an electron beam exposure method as a mask to form wire channels 3. Finally ohmic electrodes A1 and A2 are formed at the ends of the wire channels 3 by a method by itself known.

Figure 2A:
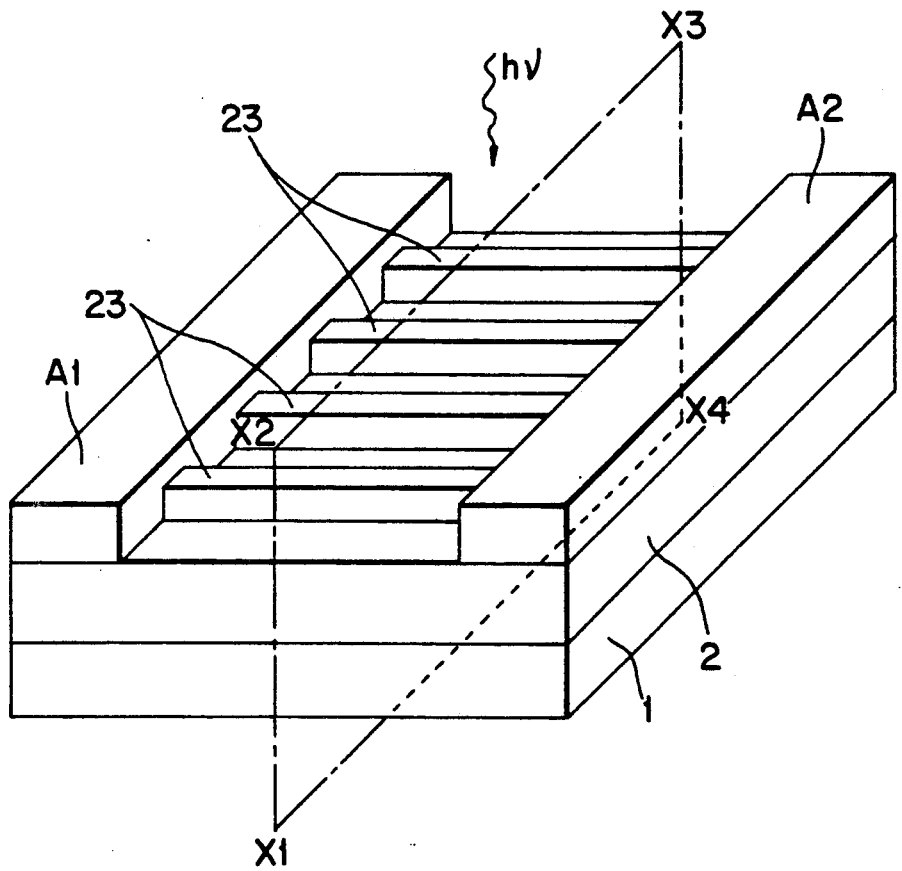
FIG. 2 a schematic illustration of construction of a photoconductor according to another embodiment of the present invention, in a manner similar to FIG. 1.
Figure 2B:
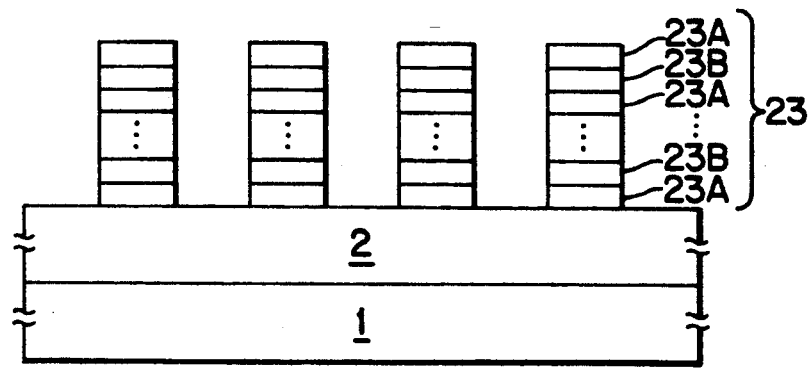
Figure 3:
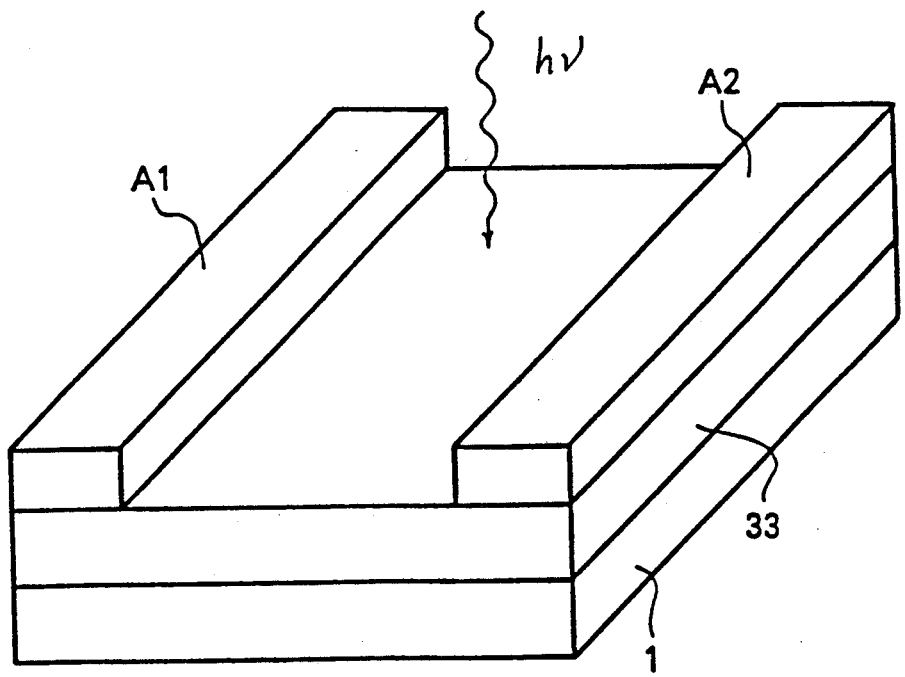
FIG. 3, as mentioned above, shows a prior art photoconductor by a perspective view.

A second embodiment of the photoconductor of the present invention has a device constitution as shown in FIG. 2(a) and FIG. 2(b). The photoconductor comprises a semi-insulated GaAs substrate 1, a non-doped $Al_{0.4}Ga_{0.6}As$ buffer layer 2 formed in a thickness of 1 μm on the substrate 1 and plural wire channels 23 in a width to an extent of 100 Å consisting of a superlattice layer of non-doped GaAs and non-doped AlGaAs formed on a surface of the buffer layer 2. At both ends of the wire channels 3, ohmic electrodes A1 and A2 are formed. The superlattice layer of the wire channels 23 consists of non-doped GaAs layers 23A in a thickness to an extent of 100 Å and non-doped $Al_{0.4}Ga_{0.6}As$ layers 23B in a thickness to an extent of 100 Å.

When a light beam having a wavelength in a range of 0.65 to 0.85 μm is impinged on the upper surface of the device, the incident light beam is absorbed only in GaAs and is transmitted through AlGaAs without absorption. Therefore, carries are photoexcited in each of the GaAs layers 23A. Since the AlGaAs layers 23B have a thickness sufficient for suppressing any leak of carriers, each of the GaAs layers constitutes an independent wire channel. The cross section of each of the GaAs layers 23A has a width and a thickness both to an extent of de Broglie wavelength of electrons and so the carriers behave in a one-dimensional manner and it becomes possible to obtain high mobility and high drift velocity.

In the above embodiments, the present invention is explained with reference to photoconductors of GaAs-/AlGaAs/GaAs system, but the present invention is not limited thereto and is naturally applicable to other material systems such as GaInAs/GaInAsP/InP system, GaInAs/AlInAs/InP system or the like.

As explained in detail as above, the present invention has enabled to obtain a high gain and a considerably increased response velocity by providing a size-quantized wires for a photoconductor as an active layer. Further, electric current can be increased by introducing a superlattice constitution into the size-quantized wires.

We claim:

1. A photoconductor comprising:
   (a) a substrate;
   (b) a first semiconductor layer formed on the substrate;
   (c) size-quantized ultrafine wire channels formed on the first semiconductor layer by a second semiconductor material having a bandgap smaller than that of the first semiconductor material, in the form of channels having cross sectional lengths comparable to an electron de Broglie wavelength; and
   (d) electrodes formed at opposite longitudinal ends of the size-quantized ultrafine wire channels.

2. The photoconductor according to claim 1, wherein the cross sectional lengths of the size-quantized ultrafine wire channels are to an extent of 100 Å in width and height.

3. The photoconductor according to claim 2, wherein the size-quantized ultrafine wire channels are formed of an undoped GaAs layer, the first semiconductor layer is formed of an undoped AlGaAs layer, and the substrate is formed of a semi-insulating GaAs.

4. The photoconductor according to claim 1, wherein the size-quantized ultrafine wire channels are formed of an undoped GaAs layer, the first semiconductor layer is formed of an undoped AlGaAs layer, and the substrate is formed of a semi-insulating GaAs substrate.

5. A photoconductor comprising:
   (a) a substrate;
   (b) a first semiconductor layer formed on the substrate;
   (c) size-quantized ultrafine wire channels formed on the first semiconductor layer by semiconductor superlattices comprising quantum well layers and potential barrier layers, in which quantum well layers are formed of a second semiconductor material having a bandgap smaller than that of the first semiconductor material and are formed to have cross sectional lengths comparable to an electron de Broglie wavelength; and
   (d) electrodes formed at opposite longitudinal ends of the size-quantized ultrafine wire channels.

6. The photoconductor according to claim 5, wherein the cross sectional lengths of the quantum well layers are to an extent of 100 Å in width and height.

7. The photoconductor according to claim 6, wherein the size-quantized ultrafine wire channels are formed of the superlattices consisting of undoped GaAs quantum well layers and undoped AlGaAs potential barrier layers, the first semiconductor layer is formed of an undoped AlGaAs layer, and the substrate is formed of a semi-insulating GaAs substrate.

8. The photoconductor according to claim 5, wherein the size-quantized ultrafine wire channels are formed of the superlattices consisting of undoped GaAs quantum well layers and undoped AlGaAs potential barrier layers, the first semiconductor layer is formed of an undoped AlGaAs layer, and the substrate is formed of a semi-insulating GaAs substrate.

* * * * *